United States Patent [19]

Sirinyan et al.

[11] Patent Number: 4,728,560

[45] Date of Patent: Mar. 1, 1988

[54] ELECTRICAL PRINTED CIRCUIT BOARDS

[75] Inventors: Kirkor Sirinyan, Bergisch Gladbach; Gerhard D. Wolf, Dormagen; Ulrich von Gizycki; Rudolf Merten, both of Leverkusen, all of Fed. Rep. of Germany

[73] Assignee: Bayer Aktiengesellschaft, Leverkusen, Fed. Rep. of Germany

[21] Appl. No.: 836,049

[22] Filed: Mar. 4, 1986

[30] Foreign Application Priority Data

Mar. 21, 1985 [DE] Fed. Rep. of Germany ....... 3510202

[51] Int. Cl.$^4$ ............................................. B32B 3/00
[52] U.S. Cl. .................................... 428/195; 428/220; 428/901; 427/438
[58] Field of Search ...................... 428/195, 220, 901; 427/92, 438

[56] References Cited

U.S. PATENT DOCUMENTS

| | | | |
|---|---|---|---|
| 3,220,897 | 11/1965 | Conley | 148/34 |
| 3,227,636 | 1/1966 | DeHart | 209/38 |
| 3,328,275 | 6/1967 | Waterbury | 204/38 |
| 3,560,257 | 2/1971 | Schneble, Jr. et al. | 117/212 |
| 3,876,479 | 4/1975 | Yamada | 156/3 |
| 4,248,632 | 2/1981 | Ehrich et al. | 106/1.11 |
| 4,286,015 | 8/1981 | Yoshida et al. | 428/305 |
| 4,299,863 | 11/1981 | Tanimoto et al. | |
| 4,357,383 | 11/1982 | Howden et al. | 428/213 |
| 4,358,479 | 11/1982 | Canestaro et al. | 427/98 |
| 4,472,458 | 9/1984 | Sininyan et al. | 427/92 |
| 4,508,780 | 4/1985 | Sirinyan et al. | 428/407 |
| 4,542,074 | 9/1985 | Sirinyan et al. | 428/450 |
| 4,563,371 | 1/1986 | Sirinyan et al. | 427/305 |

FOREIGN PATENT DOCUMENTS

| | | |
|---|---|---|
| 0053279 | 6/1982 | European Pat. Off. . |
| 0081129 | 6/1983 | European Pat. Off. . |
| 1496748 | 7/1969 | Fed. Rep. of Germany . |
| 2320099 | 10/1973 | Fed. Rep. of Germany . |
| 1337338 | 11/1973 | United Kingdom . |

OTHER PUBLICATIONS

Journal of Polymer Science, Polymer Chem. Ed., Mark et al., vol. 21, No. 11, 3101-3114, 1983, Novel Polyurethanes with Macroheterocyclic.

M. J. Aggleton, E. R. Wood, Semi- and Fully-Additive Printed Circuitry, Juniper Journals Ltd., New Electronics, vol. 3, No. 6, pp. 45, 46, 48, Mar. 18, 1975.

Farb, Metallurgy-p. 32, Week 83/30 M13.

German Standard DIN 40 804.

Primary Examiner—John E. Kittle
Assistant Examiner—Patrick J. Ryan
Attorney, Agent, or Firm—Sprung, Horn, Kramer & Woods

[57] ABSTRACT

Electrical printed circuit boards are obtained in an elegant manner without the usual etching methods and without using bonding agent layers in a wet chemical manner on the basis of the principles of the semi or fully additive technique by using precious metal compounds for activation and base material of a type which has (a) a specific total pore volume per unit area of 0.015-0.045 dm$^3$/m$^2$, (b) a mean pore diameter of 0.05-5.0 μm and (c) a mean pore depth of 0.05-4.0 μm.

5 Claims, No Drawings

ELECTRICAL PRINTED CIRCUIT BOARDS

It is generally known that to manufacture electrical printed circuit boards holes are made in metal-clad or metal-laminated insulating base materials, the drilled holes are plated through by chemical means, the substrate surface is covered with a mask, the exposed metal surface is provided by electrodeposition means with an etch-resistant metal resist, the mask is removed from the substrate surface in a suitable medium and then the basic metal layer is etched away. The metal coatings used for carrying out this process (subtractive process) consist in most cases of pure electrolytic copper and have a layer thickness of 17.5 to 70 $\mu$m.

The known subtractive processes have not only the disadvantage that they consist of several partial steps, but they lead in the final step to undercutting of the conductor tracks.

A further disadvantage of the known processes consists in the fact that they require metal resists.

During the application of the metal resist coating the metal resist growing by electrodeposition may also "proliferate" laterally. The terms "overplating" or even "mushroom formation" of the conductor tracks are used, which refers to the mushroom-like shape to be seen in the cross-section and to the poor image definition. This undesired effect is still further intensified by the subsequent etching away of the basic copper layer. In order to avoid the said "overplating" or "mushroom formation", mechanically robust and thick film resists have to be used.

Such mechanically robust film resists are intended to "canalize" both the copper conductors and also the resist metal and consequently prevent mushroom formation.

A further very serious disadvantage of the metal resists consists in the fact that during soldering they melt and lead to the known orange-peel effect. This effect cannot be accepted particularly in the case of high-quality printed circuit boards. As a further disadvantage of the subtractive process it may be mentioned that it is not suitable for the manufacture of fine-track printed circuit boards with a conductor-track width of $\leq 100$ $\mu$m for the said reasons.

To avoid the disadvantages specified, attempts have already been made to develop the so-called semi-additive or fully additive processes. To carry out these processes the application of a thin electrically conducting metal coating which adheres well and is stable in solder baths is of the greatest importance.

It is further known that the deposition of highly adhesive metal coatings on the usual insulating base materials requires an expensive pretreatment. Thus, for example the substrates of glass-mat reinforced epoxy resins or paper-reinforced phenolic resins used for the manufacture of printed circuit boards have first to be provided with a layer of bonding agent and then treated with an oxidizing liquid, preferably chromosulphuric acid, before the boards prepared in this way are activated with ionic or colloidal precious metal solutions, masked and metallized in commercial metallizing baths.

Apart from the many stages of this method this technique has the disadvantage that entrained chromium ions irreversibly poison the baths and that the printed circuit boards obtained exhibit unsatisfactory electrical properties.

It has therefore already been proposed to activate the non-conducting surfaces of substrates, for example base carriers of printed circuit boards without oxidative pretreatment with a solution or a resist of a precious metal complex formation or of palladium chloride for the subsequent chemical metallization (cf., for example, DE-A No. 1,696,603 and DE-A No. 2,116,389, corresponding to U.S. Pat. Nos. 3,560,257 or 4,248,632).

However, these activation processes, which are per se kind to the material, have hitherto been unable to establish themselves in practice since they require relatively large quantities of precious metal and they do not achieve the high peel strength of the metallic coatings required in the electronics industry. For this reason an additional surface treatment with etchant is recommended at least in the first-named patent publication (cf. column 6, line 48).

It has now been found that these disadvantages are avoided and high-quality printed circuit boards are obtained in a simple manner, i.e. without etching and without a bonding agent layer, by means of a semi or fully additive technique using activator systems based on organic compounds of precious metals of the 1st or 8th sub-group of the periodic system of elements if a base material is used whose surface is characterized by (a) a specific total pore volume per unit area of 0.015–0.045 dm$^3$/m$^2$,
(b) a mean pore diameter of 0.05–12.0 $\mu$m and
(c) a mean pore depth of 0.05–12.0 $\mu$m.

The preferred pore volume is between 0.020 and 0.040 dm$^3$/m$^2$, in particular between 0.023 and 0.038 dm$^3$/m$^2$.

Preferred pore diameters are 0.5–5 $\mu$m, in particular 1–2 $\mu$m.

Preferred pore depths are 0.5–2.5 $\mu$m.

Compared to the "semiadditive methods" also known which are characterized by the laminating on of thin-layer coatings produced by electrodeposition or by the chemical deposition of metals with the aid of a rubber-containing bonding agent coating, the manufacture of the new printed circuit boards is distinguished by a smaller expenditure of labour and improved mechanical, thermal and electrical properties of the polymeric base material.

The process for the manufacture of printed circuit boards is characterized in that the base material with the surface finish specified above is treated with an organo-metallic activator system of the specified type, optionally sensitized with a reducing agent, the semifinished products thus obtained are metallized over the whole area or partially in a wet-chemical metallizing bath and then the printed circuit boards are finished employing the known principles of the semi or fully additive technique.

In a particular embodiment of the process according to the invention, to increase the process reliability, the printed circuit board base materials are annealed at a temperature from 50° C. up to the decomposition range, preferably in the range of the softening temperature.

For the production of the surface finish according to the invention both physical methods (e.g. special sand-blasting techniques or laser irradiation) and also chemical processes (e.g. treatment with solvents having selective action) are suitable. Another variant for the production of these surfaces consists in removing from the metal-clad substrates their cladding by chemical means in a redox bath (see, for example, G. Herrmann et al. "Leiterplatten, Herstellung und Verarbeitung" ("Printed circuit boards, manufacture and processing"), pages 103 to 108, G. Leuze Verlag, Saulgau/Württ. 1978) or by electrolytic means, whereupon the surface structure according to the invention is automatically established. The metallized substrates used as starting materials are, in particular, commercial board materials for the subtractive technique which are metal-clad on both sides, preferably clad by using electrolytic copper films are characterized by the standard codes FR-2, FR-3, FR-4, FR-5, G-10 and G-11 and are described in more detail further below.

For the removal of the metal-cladding both acidic and also neutral and alkaline redox baths are suitable. For example, mention may be made of hydrochloric acid or sulphuric acid-containing redox systems based on $H_2O_2$, $ClO_3^-$ and $Fe^{3+}$, and also of ammoniacal redox systems containing sodium chlorite and ammonium persulphate. Other redox systems which effect an etching away of the metal coating can also be used for carrying out the method provided that the plastic material surface is not attacked by the redox bath used. For this reason the usual aggressive plastic material pickling baths based on chromosulphuric acid should, if possible, be avoided, especially as the latter also impair the physical properties of the carrier material.

Optimum surface structures are achieved if the starting point is a board material which has been clad with metal foil produced by electrodeposition.

Specifically, such metal foils have a particular porosity which, when clad onto the polymeric carrier material, is decisively responsible for the production of the special surface finish of the base materials.

The development of porosity can be promoted by adding to the electroplating baths complex compounds based on antimony, cadmium, iron, selenium and tellurium or subsequently roughing up the electrolytic foil by chemical or mechanical means.

The production of such a metal (preferably copper) foil characterized by a porous surface structure has frequently been described in the literature. In this connection mention may be made of "Metalloberfläche" ("Metal surface"), Volume 31 (12), 563 (1977), Volume 38 (10), 439 et seq. (1984) and Volume 38 (3), 103 et seq. (1984), and also of the following patent literature: DE-A. No. 2,235,522, DE-A No. 2,249,796, DE-A No. 2,500,160, DE-B No. 1,496,748, U.S. Pat. No. 3,220,897, U.S. Pat. No. 3,328,275, U.S. Pat. No. 3,580,010 and U.S. Pat. No. 3,227,636. Using the process of the last-named U.S. Patent, porous metal (copper) foils are obtained, the porous side of which has a particularly effective metal/metal oxide structure.

Incidentally, in addition to metal foils of this type, thermally stable separating films can be used for the transferring of the desired porous structure to the base materials. Separating films of this type with softening points of 150° to 400° C. are known and consist, for example, of polyhydantoins, aromatic polyester, polyamide and polyimide types (as well as mixtures thereof) and of fluorine-containing polymers.

Suitable metal foils are derived in principle from all the common metals which can be electrodeposited such as Co, Ni, Pt, Pd, Ag, Al and especially Au and in particular Cu, and also mixtures thereof (cf., for example, "Plating", 52, 228–232 (1965)).

For example, in the manufacture of the metal-clad board material the procedure is as follows:

The glass mats impregnated with resin material and hardener are compressed at elevated temperature between two porous metal foils. In this process it is advisable to allow the resin mats to harden slightly in the hot pressing tool before the full final pressure is used so that the highly fluid resin is not pressed out sideways.

After etching of the metal cladding a surface structure which corresponds in its dimensions to those of the base material to be used according to the invention is obtained on the polymeric base material.

For producing the surfaces according to the invention by sand blasting, the powder material should have a mean grain size of 0.1–10 $\mu$m, preferably 5–7 $\mu$m. Powder materials based on quartz, corundum and diamond are well suited for carrying out the process. To avoid a chemical degradation of the polymeric base material the sand blasting can of course be undertaken in an inert gas atmosphere.

Preferably the porous surface structure suitable for carrying out the process according to the invention can be achieved by the known membrane-production methods (cf. for example, DE-A No. 24 31 071, U.S. Pat. No. 4,286,015, DE-A No. 32 05 289 and GB No. 2,030,843). Here the polymeric base material is wetted in a known manner with a solution of prepolymers or polymers which are identical in their chemical nature with the base material, in mixtures of solvents of different volatility, which optionally contain swelling agents and pore formers. The readily volatile solvent is partially evaporated and the coagulant or filler is then extracted from the polymer matrix, for example, under vacuum.

The "specific total pore volume per unit area" is the product of the specific total pore volume ($cm^3/g$) and the mass per unit area ($g/m^2$) of the base material, i.e.

$[cm^3/g]\cdot[g/m^2]=[cm^3/m^2]$ or $[10^{-3}\cdot dm^3m^2]$

The definition of the specific total pore volume of solid surfaces is found in Angew. Chem. 84. pages 331–336 (1972).

By "mean pore depth" and "mean pore diameter" are meant the mean values (having regard to the normal Gaussian distribution) of the pore dimensions determined with the scanning electromicroscope.

The organic precious metal compounds to be used according to the invention are known activator systems, for example Pd and Pt complexes of dienes, polymeric complexing agents and $\alpha,\beta$-unsaturated ketones such as are described, for example in DE-A Nos. 30 25 307, 31 50 985 and 33 24 767.

Preferred are organometallic compounds, preferably $\pi$-complex compounds, which, in addition to the group necessary for the metal bonding, contain at least one further functional group. Such compounds are known and are described in DE-A No. 3 148 280.

With the further functional group a very good strength of adhesion to the substrate surface is obtained, this strength of adhesion possibly originating in a chemical reaction with the substrate surface or in an adsorption.

Particularly suitable for chemically anchoring the activator on the substrate surface are functional groups such as carboxylic acid groups, carboxylic acid halide groups, carboxylic acid anhydride groups, carboxylic ester groups, carboxylic amide groups and carboxylic imide groups, aldehyde and ketone groups, ether groups, sulphonamide groups, sulphonic acid groups and sulphonate groups, sulphonic acid halide groups, sulphonic acid ester groups, halogen-containing heterocyclic radicals such as chlorotriazinyl, chloropyrazinyl, chloropyrimidinyl or chloroquinoxalinyl groups, activated double bonds such as in vinylsulphonic acid or acrylic acid derivatives, amino groups, hydroxyl groups, isocyanate groups, olefin groups and acetylene groups and also mercapto groups.

Particularly preferred are those precious metal complex compounds in which the ligands and the ions or molecules to be complexed have a "guest/host" interrelation.

As selective complex ligands cyclic or acyclic compounds are suitable which because of their chemical and/or physical nature are a host molecule or, in the presence of ionogenic or neutral compounds to be complexed assume the form necessary for complex or adduct formation, the polar regions, in the presence of the medium to be complexed, being directed towards the latter.

In the literature numerous selective host molecules have been described which can form a selective guest/host complex with the alkali metal or alkaline earth metal cations such as $Li^+$, $Na^+$, $K^+$, $Ca^{2+}$ or $NH_4^+$ [cf. E. Weber, "Kontakte" ("Contacts") (Darmstadt) 1, (1981) and J. G. Schindler, "Bioelektrochemische Membranelektroden" ("Bioelectrochemical membrane electrodes"), pages 77–104, Walter de Gruyter Verlag, Berlin/New York (1983)]or with heavy metal ions such as $Co^{2+}$, $Ni^{2+}$, $Fe^{3+}$, $Cd^{2+}$ and $Ag^+$, and also with anions such as $Cl^-$ and $SO_4^{2-}$ [cf. publication by J. G. Schindler cited above, pages 104–112also with the neutral ligands or compounds.

For carrying out the activation all the host complex ligands are suitable which contain heteroatoms (O, N and S) in their chain. Well suited are crown ethers, cryptands and podands or derivatives thereof, and also cyclic peptides; furthermore, tetrahydrofuran-containing ester-linked macrolides and analogous compounds based on heteroatoms such as S and N which are known, for example, in biological systems as transport regulators.

A definition of the terms "crown ethers", "cryptands" and "podands" can be found in the review papers by F. Vügtle in "Kontakte" ("Catalysts") (Darmstadt) (1977) and (1978), by E. Weber in "Kontakte" ("Catalysts") (Darmstadt) (1984) and also by Vögtle in "Chemikerzeitung" 97, 600–610 (1973).

Particularly preferred are substituted or unsubstituted host ligands based on cyclic or acyclic crown ethers, which may also contain in their ring system additional heteroatoms such as N and S. Such compounds are described in DE-A No. 2 842 862 or EP-A No. 10 615 and correspond, for example, to the formulae

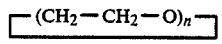 (I)

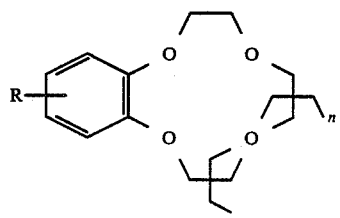 (II)

n=0-4
R=alkyl, aryl, halogen etc.

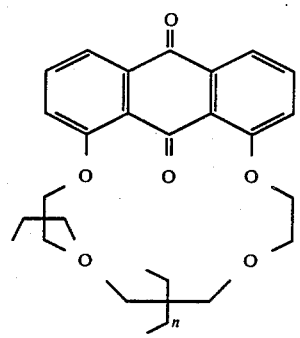 (III)

n=0-4

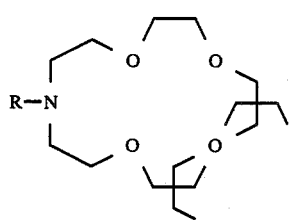 (IV)

n=0-4
R=alkyl or aryl; e.g. methyl, ethyl, phenyl, biphenyl, phenylazophenyl etc.

Preferred are the abovementioned cyclic compounds.

Another variant for carrying out the activation process consists in building the host molecules mentioned into polymeric or oligomeric compounds covalently and then complexing them with the desired activating medium. Such oligomeric or polymeric systems are known and are described, for example, in "Novel polyurethanes with Macroheterocyclic (Crown Ether) Structures in the Polymer Backbone", J. E. Herweh, J. of Polymer Science; Polymer Chemistry Edition, Vol. 21, 3101 (1983).

The inorganic part of the host/guest molecules is formed preferably
1. from compounds of the formula

wherein
Me represents hydrogen, alkali metal or alkaline earth metal atoms or heavy metal atoms (Fe, Co, Ni or Cu) or $NH_4$,
Hal represents halogen (preferably Cl and Br) and
E represents a precious metal atom of the 1st or 8th sub-group of the periodic system (preferably Pt, Pd and Au) with the valency m or n respectively and the coordination number z, where z−m=n, or 2. from the cations of the said elements, preferably $Ag^+$, $Cu^{2+}$ and $Cu^+$ or preferably 3. from non-complex salts of these elements of the formula

or 4. from the usual colloidal systems of these precious metals.

Precious metal compounds to be used by preference are those of the formula $H_2PdCl_4$, $Na_2(PdCl_2Br_2)$, $Na_2PdCl_4$, $Ca\ PdCl_4$, $Na_4(PtCl_6)$, $AgNO_3$, $HAuCl_4$, $CuCl_2$ and $CuCl$. Preferred are the Pd compounds.

Suitable colloidal precious metal systems are derived especially from the metals Pd, Pt, Au and Ag and are described, for example, in "Kunststoffgalvanisierung" ("Electroplating of plastic materials") by R. Weiner, Eugen G. Leuze Verlag, Saulgau/Württ. (1973), pages 180–209.

The preparation of the activating solution may take place by dissolution of the host molecule in a suitable aprotic solvent with boiling points around 80° C. such as perchloroethylene, 1,1,1-trichloroethane, $CH_2Cl_2$, petroleum ether or chloroform and addition of the precious metal system in accordance with the principle already mentioned.

Another possibility for the preparation of the activating system is to take the said precious metals in an aqueous phase and to allow them, again in accordance with the principle mentioned, to diffuse or complex into an organic phase which contains the host molecules capable of complex formation, separate the organic phase from the aqueous phase, neutralize it by washing, free it of the solvent by recrystallization or evaporation and then use it in a desired liquid medium for the activation.

The activators may be used in concentration ranges from 0.001 g/l (referred to the precious metal) up to the respective solubility limit. Preferably 0.1 to 3.0 g/l of these substances are employed.

Due to their high storage stability (no occurrence of turbidity in the solutions—in some cases after weeks of storage) and their strong sorption in the ultraviolet and/or visible spectral range, they are excellently suitable for continuous concentration monitoring with a photometer.

Incidentally, the sorption properties of the complex compounds to be used according to the invention may be increased still further by the introduction of special substituents (in particular $-NO_2$, $-NR_3$, $-SO_3H$ and $-CN$).

To increase the peel strength of the activator or metal coating respectively the said host molecules may be provided additionally with a further functional group.

Particularly suitable for anchoring the activator chemically on the substrate surface are functional groups such as carboxylic acid groups, carboxylic acid halide groups, carboxylic acid anhydride groups, carboxylic ester groups, carboxylic amide and carboxylic imide groups, aldehyde and ketone groups, ether groups, sulphonamide groups, sulphonic acid groups and sulphonate groups, sulphonic acid halide groups, sulphonic acid ester groups, halogen-containing heterocyclic radicals such as chlorotriazinyl, chloropyrazinyl, chloropyrimidinyl or chloroquinoxalinyl groups, activated double bonds such as in vinylsulphonic acid or acrylic acid derivatives, amino groups, hydroxyl groups, isocyanate groups, olefin groups and acetylene groups and also mercapto or alkenyl radicals from $C_8$ upwards, in particular oleic, linoleic, stearic or palmitic groups.

If no anchoring takes place through a chemical reaction, the strength of adhesion may also be effected by adsorption of the organometallic activators on the substrate surface, suitable causes for the adsorption being, for example, hydrogen bridge bonds or van der Waal forces.

It is expedient to match the functional groups which produce the adsorption to the particular substrate. Thus, for example, long-chain alkyl or alkenyl groups in the activator molecule improve the strength of bonding to substrates of polyethylene or polypropylene. On the other hand, for the metallization of objects based on polyamides or polyesters, activators with, for example, additional carbonyl or sulphonyl groups are particularly beneficial.

Particularly suitable for anchoring the activator on the substrate surface by adsorption are functional groups such as carboxylic acid groups, and carboxylic acid anhydride groups.

In carrying out the activation in practice the procedure is in general such that the base carrier to be metallized is wetted with a solution of the selective metal complex in a suitable organic solvent, the solvent is removed and sensitization is optionally carried out with a suitable reducing agent. The carrier pretreated in this manner can then be metallized in a suitable metallizing bath.

As reducing agents for the sensitization, aminoboranes, alkali metal hypophosphites, alkyl borohydrides, hydrazine hydrate and formaldehyde are suitable. The wetting of the substrates may take place by spraying, printing, soaking or impregnating.

In order to increase the adhesion of the metal coating to the carrier surface, those solvents or solvent mixtures are used with particular preference which result in a slight solubilizing or swelling of the plastic material surface to be metallized.

For carrying out this process aprotic solvents such as 1,1,1-trichloroethane, methylene chloride, trichloromethane, perchloroethylene and toluene are particularly well suited. Activation systems according to the invention are preferably used which also contain additionally hydrolysable organometallic compounds of titanium, aluminium, zirconium, silicon or tantalum in quantities of 0.1–20, preferably 0.1–3, particularly preferably 0.1–2 g/l.

The removal of the solvent from the wetted carrier takes place simply by evaporation or, in the case of higher boiling compounds by extraction.

According to a preferred process variant the organic activating baths are monitored using a photometer as detector.

A very particularly preferred embodiment of the activation consists in carrying out the reduction in the metallization bath directly using the reducing agent of the electroless metallization.

This embodiment is very particularly suitable for aminoborane-containing nickel baths or formaldehyde-containing copper baths.

As metallization baths which can be used in the process according to the invention commercial hot and cold baths of nickel salts, cobalt salts, copper salts, gold and silver salts or mixtures thereof are suitable, the Cu baths being very particularly preferable.

For an electrodeposited reinforcement to be carried out optionally the following metals are suitable: Ni, Co, Cu, Ag, Al, Cr and Au. Preferred are Cu, Au and Ni, and very particularly preferred is Cu.

In order optionally to increase the adhesion of the metal coating deposited on the plastic material surface according to the invention or to guarantee a 100% process reliability, an annealing may be undertaken. It is notable that, surprisingly, in contrast to the other processes (see for example DE-A No. 32 42 162 and U.S. Pat. No. 4 327 126), the annealing can be undertaken on already finally hardened boards, which makes the process universally applicable, i.e. independent of the storage time of the carrier material.

The annealing temperature may be varied in wide limits from 50° C. up to the particular decomposition range of the polymeric base material, the temperatures from 125° C. to 180° C., in particular the softening range of the polymeric base material, being preferred for the "FR-4" material and the temperatures from 80° C. to 130° C., in particular the softening range, for FR-2 and FR-3. The annealing times may be varied between 5 minutes and 10 hours, the times 10 to 60 minutes being particularly preferred. In order to avoid a degradation of the base material, the annealing may be undertaken under inert gas.

Obviously, the annealing may also be undertaken after the reinforcement by electrodeposition or chemical reinforcement of the metal coating to the desired layer thickness.

Preferred plastic materials for the manufacture of the substrates are hardenable thermosetting resins such as phenolic, epoxy, melamine and polyester resins, the phenolic or epoxy resins (FR-2, FR-3, FR-4 and FR-5) being used with very particular preference.

The thermosetting substrates may be reinforced with reinforcing materials such as with glass, mineral, coal and aramide fibres or mats and mixtures thereof with each other.

The so-called semifinished products obtained from these base materials by activation and optionally making drilled holes, and also the printed circuit boards manufactured therefrom, surprisingly, have the following good properties:
1. They are resistant in air to moisture, and weather and thermal influences.
2. Their activator coating cannot be removed from the surface during the application or development of the photoresist coatings. It can be detected without difficulty by means of known surface analysis methods such as ESCA.
3. The peel strength of the metal coating according to DIN 53 494 is at least 22.5, but preferably 30–35 N/25 mm and in many cases greater than 50 N/25 mm.
4. During the sensitization or metallization no poisoning of the metallization or sensitization baths occurs.

These advantages are not displayed or displayed to a substantially lower degree by those semi-finished products and printed circuit boards which are produced on the basis of substrates of the additive technique which are coated with metal films deposited non-electrolytically. The surfaces of the "semifinished products" may be provided with an easily removable aluminium foil or plastic material film. The aluminium foil in particular acts as a drilling aid and protects the substrate surface from external influences.

The printed circuit boards according to the invention are suitable for the manufacture of all types of single- or multi-layer printed circuits. Preferably plated-through circuits are manufactured.

EXAMPLE 1

A commercial glass-mat reinforced epoxy resin board (200×40×1.5 mm) (FR-4 quality) provided with pores on the surface by diamond blasting (mean grain size approx. 4 μm) having a specific total pore volume per unit area of 0.018 dm$^3$/m$^2$ and a mean pore diameter of 1 μm and a pore depth of 1.2 μm is treated for 5 minutes in a solution consisting of 0.01 mol of 1,4,7,10,13,16-hexaoxacyclooctadecane Na$_2$PdCl$_4$ complex compound, 2.5 g of tetrabutyl titanate and 1,000 ml of CCl$_2$=CCl$_2$, sensitized for 5 minutes in a bath consisting of 500 ml of distilled H$_2$O, 5 ml of NH$_3$ (25%, super pure) and 2 g of DMAB (dimethylaminoborane), washed and then copper-plated in a commercial copper-plating bath for 60 minutes. The boards were then annealed in a drying oven in an N$_2$ atmosphere at 170° C. for 45 minutes.

A polymer-metal laminate material with a metal coating which adheres well and is solder bath resistant is obtained. It is suitable for the manufacture of printed circuits.

EXAMPLE 2

A commercial glass-mat reinforced epoxy resin board (200×40×1.5 mm, having a specific total pore volume per unit area of approx. 0.02 dm$^3$/m$^2$ and a mean pore diameter of 1.2 μm and a pore depth of 1.5 μm respectively, FR-4 quality) provided on the surface with pores by corundum blasting (mean grain size 2.5 μm) is drilled and then treated in a solution consisting of 0.009 mol of 1,4,7,10,13,16 -hexaoxacyclooctadecane HAuCl$_4$ complex compound and 1,000 ml of postpurified CH$_2$Cl$_2$ for 7.5 minutes.

The board prepared in this way is sensitized in a bath consisting of 750 ml of H$_2$O, 5 g of NaOH (solid) and 15 ml of hydrazine hydrate for 3.5 minutes and then provided with a Cu coating approx 1.0 μm thick in a commercial chemical Cu bath at 75° C., covered using a commercial UV-hardenable screen printing resist with a mask which has exposed comb-shape continuous tracks of about 500 μm, annealed for 25 minutes at 230° C. and finally reinforced with electrodeposited nickel to approx. 40 μm. After freeing the test body of resist or etching away the Cu coating located thereunder in a differential etching process a plated-through electrical printed circuit board is obtained which can be soldered by conventional methods.

The metal layer adheres to the substrate surface so well that it cannot be removed from the substrate surface despite a 3-minute postannealing at 260° C. in a conventional soldering bath.

EXAMPLE 3

15 g of methanolic K$_2$PtCl$_6$ solution (Pt content about 1.75% by weight) are added to 1 l of CH$_2$Cl$_2$ which also contains additionally 3.5 g of crown ether compound of the formula

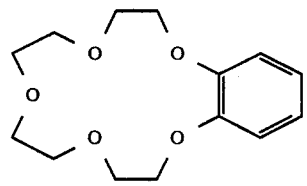

(see, for example, Makromol. Chem., Rapid Commun. 5, pages 115–118 (1984)) at 45° C., and stirring is then continued for 45 minutes. Then 1.5 g of tetraisopropyl octotitanate are added.

A dark-coloured homogeneous activating solution is obtained. Glass-mat reinforced epoxy resin boards (200×200×1.5 mm) provided with pores as in Example 1 are treated with this solution for 5 minutes. The board activated in this way, i.e. provided with an organometallic Pt crown ether coating, is sensitized in a sensitizing bath which contains per liter 20 ml of NH$_2$—NH$_2$ and 12 ml of NH$_3$ (25%), for 7.5 minutes and then metallized in a commercial copper-plating bath at 80° C. for 45 minutes and subsequently posttempered in a helium atmosphere at approx. 195° C. for approx. 90 minutes. A board provided with a well adhering Cu coating approx. 0.7 μm thick is obtained which can be processed to give a solderable conventional printed circuit board after a partial masking with a commercial photoresist, after a reinforcement of the exposed tracks by electrodeposition and subsequent freeing of the board surface of the photoresist or of the Cu layer thereunder.

The printed circuit boards manufactured in this way can be soldered without difficulty using conventional soldering systems and pass the standard thermal shock test of the industry.

EXAMPLE 4

A commercial glass-mat reinforced epoxy resin board (FR-4) for the subtractive technique, coated on both sides with electrolytic copper, for example made by Isola AG, Düren (Germany), is drilled and the dust is then removed. This board is freed from the Cu coating by etching away in an alkaline 15.7% sodium chlorite solution (pH approx. 12), detoxicated in a 2% NaHSO$_3$ solution, washed with H$_2$O and then with methanol, and dried. A board porous on the surface with a specific total pore volume per unit area of approx 0.028 dm$^3$/m$^2$ and a mean pore diameter of 2.0 μm and a mean pore depth of 2.5 μm respectively is obtained. It is subsequently activated for 5 minutes in a solution consisting of 1.58 g of 4-cyclohexene-1,2-dicarboxylic acid anhydride/palladium(II) chloride, 1,500 ml of postpurified CH$_2$Cl$_2$ and 2.15 g of tetrabutyl titanate, dried and then sensitized in a solution consisting of 750 ml of distilled H$_2$O, 7.5 g of dimethylaminoborane and 1.75 g of NaOH (solid), copper-plated in a commercial copper-plating bath, washed with distilled H$_2$O, and annealed in a drying oven at 178° C. The sample thus provided with a well adhering electrically conducting metal coating is coated by means of the screen printing method with a resist based on polybutadiene which has exposed raster-shape tracks of approx. 100 μm and then the exposed metal surface is reinforced with electrodeposited copper to approx. 45 μm. Now the sample body is freed of the mask in methyl ethyl ketone and the Cu coating deposited by chemical means located thereunder is etched away in a solution of 500 ml of distilled H$_2$O, 8.5 ml of HCl (37% superpure) and 18.5 ml of H$_2$O$_2$.

A plated-through electrical printed circuit board is obtained with conductor tracks approx. 100 μm wide and 44 μm thick. The metal coating adheres to the substrate so well that it cannot be removed from the substrate surface despite a 25-minute thermostressing at 225° C. This metal coating can be soldered by conventional methods.

EXAMPLE 5

An epoxy resin board reinforced with glass and aramide fibres is coated with a solution consisting of 15 g of commercial epoxy resin starting material based on bisphenol A with an equivalent quantity of aromatic hardener (diaminodiphenyl sulphone) in 1,000 ml of CH$_2$Cl$_2$ (readily volatile component) and 85 ml of N-methylpyrrolidone (low-volatility component) by dipping, and dried for 2 h at room temperature. The precondensate layer applied in this manner is hardened at 120° C. for 20 minutes and then the N-methylpyrrolidone enclosed in the polymer matrix is extracted from the polymer matrix at 210° C. under water-jet vacuum.

A porous board is obtained with a specific total pore volume per unit area of 0.034 dm$^3$/m$^2$ and a pore diameter of 2.2 μm and pore depth of 1.8 μm respectively which can be processed to give conventional printed circuit boards as in Example 1. The adhesion of the metal coating is good and passes the soldering bath or thermal shock test.

EXAMPLE 6

An epoxy resin board of FR-4 material copper-clad on both sides and cut to Europa format is freed of the Cu coating in a redox solution consisting of 50 ml of HCl (37%), 60 ml of H$_2$O$_2$ and 500 ml of H$_2$O. A board porous on the surface is obtained with a specific total pore volume per unit area of 0.024 dm$^3$/m$^2$ and a mean pore diameter of 2.5 μm or a maximum pore depth of 3.0 μm. This board is activated in a solution consisting of 200 ml of acetone, 800 ml of distilled H$_2$O and 0.8 g of mesityl oxide palladium chloride in the course of 3 minutes. The board is then treated for 5 minutes in a solution of 5 g of dimethylaminoborane in 1 l of an H$_2$O/methanol mixture (50:50% by volume). After a short rinse a Cu coating approx. 0.5 μm thick is applied in a chemical Cu bath. The chemically copper-plated board is then annealed for 1 hour at 160° C. and reinforced by electrodeposition as in Example 4 and then freed of the remaining Cu. A solderable printed circuit board is obtained with a very good metal adhesion.

EXAMPLE 7

An epoxy resin board of FR-2 material copper clad on both sides and cut to Europa format is freed of the Cu coating as in Example 4. A board porous on the surface with a specific total pore volume per unit area of 0.020 dm$^2$/m$^2$ is obtained. This board is metallized as in Example 4, annealed for 14 minutes at 150° C. and 25 minutes at 120° C. and then processed as in Example 4. A printed circuit board with good metal adhesion is obtained. This board can be soldered by conventional methods.

EXAMPLE 8

A conventional board of phenol formaldehyde resin (FR-2) is provided with pores as in Example 2, activated, copper-plated, and annealed for 10 minutes at 150° C. and then for 30 minutes at 110° C. A substrate provided with a well adhering Cu coating approx. 1.0 μm thick is obtained which can be processed to give a solderable printed circuit board by the process described in Example 6.

We claim:

1. An electrical printed circuit board consisting essentially of a base material and a metallic conductor pattern thereon, the circuit board being produced by base materials with an electrolytically produced metal foil, the cladding being removed chemically in a redox bath or electrolytically, the base material being activated with a compound of a precious metal with or without sensitization, metallic conductor patterns being applied to the semifinished products so obtained by using a semi or fully additive technique and annealing at a temperature of 50° C. to 180° C., wherein the activator being an organic compound of a precious metal of the 1st or 8th sub-group of the periodic system of elements and wherein the surface of the base material being characterized by (a) a specific total pore volume per unit area of 0.015–0.045 dm$^3$/m$^2$,
(b) a mean pore diameter of 0.05–12.0 μm and
(c) a mean pore depth of 0.05–12.0 μm.

2. An electrical printed circuit board according to claim 1, wherein the precious metal compounds are selected from the group consisting of Pt, Pd, Au, Ag, Rh and mixtures thereof.

3. An electrical printed circuit board according to claim 1, wherein (a) the pore volume is 0.020–0.040 dm$^3$/m$^2$,
(b) the pore diameter is 1–2 μm and
(c) the pore depth is 0.5–2.5 μm.

4. An electrical printed circuit board according to claim 1 wherein the metal clad is a copper or aluminum foil prepared by electrodeposition.

5. An electrical printed circuit board according to claim 1, wherein the annealing is conducted for a time of 10 to 60 minutes.

* * * * *